(12) United States Patent
Eom et al.

(10) Patent No.: US 11,758,785 B2
(45) Date of Patent: Sep. 12, 2023

(54) DISPLAY DEVICE

(71) Applicant: Samsung Display Co., Ltd., Yongin-Si (KR)

(72) Inventors: Cheolhwan Eom, Asan-si (KR); Kwang-Min Kim, Seoul (KR); Hyeaweon Shin, Seongnam-si (KR); Sang Joon Ryu, Asan-si (KR); Hyungjun An, Hwaseong-si (KR); Minji Lee, Asan-si (KR); Yul Kyu Lee, Hwaseong-si (KR); Jeahyun Lee, Cheonan-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 37 days.

(21) Appl. No.: 17/380,074

(22) Filed: Jul. 20, 2021

(65) Prior Publication Data

US 2021/0351245 A1 Nov. 11, 2021

Related U.S. Application Data

(63) Continuation of application No. 16/899,698, filed on Jun. 12, 2020, now Pat. No. 11,101,329, which is a (Continued)

(30) Foreign Application Priority Data

Apr. 17, 2018 (KR) .......................... 10-2018-0044651

(51) Int. Cl.
*H10K 59/35* (2023.01)
*H10K 59/131* (2023.01)
(Continued)

(52) U.S. Cl.
CPC ........... *H10K 59/35* (2023.02); *G09G 3/3258* (2013.01); *H01L 23/3114* (2013.01);
(Continued)

(58) Field of Classification Search
CPC ............ H01L 27/3211; H01L 23/3114; H01L 23/5384; H01L 27/3276; G09G 3/3258;
(Continued)

(56) References Cited

U.S. PATENT DOCUMENTS 9,129,927 B2 9/2015 Gupta et al.
11,101,329 B2 * 8/2021 Eom ................... H01L 27/3276
(Continued)

FOREIGN PATENT DOCUMENTS

KR 10-2016-0038632 A 4/2016

OTHER PUBLICATIONS

Korean Notice of Allowance corresponding to Application No. 10-2018-0044651 and dated Sep. 15, 2022, 7 pages.

*Primary Examiner* — David Vu
*Assistant Examiner* — Brandon C Fox
(74) *Attorney, Agent, or Firm* — Innovation Counsel LLP (57) ABSTRACT

A display device may include a display panel including a substrate that includes a display area and a pad area adjacent to the display area, and a first pad and a second pad on the pad area of the substrate, and a chip-on-film package over the pad area of the substrate with the first pad and the second pad in between, the chip-on-film package including an insulation layer, a first wiring on an upper surface of the insulation layer and electrically connected to the first pad, and a second wiring on a lower surface of the insulation layer and electrically connected to the second pad. A first signal having alternating voltage levels may be applied to the first wiring, and a second signal having a constant voltage level may be applied to the second wiring.

10 Claims, 7 Drawing Sheets

Related U.S. Application Data continuation of application No. 16/259,523, filed on Jan. 28, 2019, now Pat. No. 10,686,017.

(51) Int. Cl.
*H01L 23/31* (2006.01)
*H01L 23/538* (2006.01)
*G09G 3/3258* (2016.01)

(52) U.S. Cl.
CPC ....... *H01L 23/5384* (2013.01); *H10K 59/131* (2023.02); *G09G 2300/0804* (2013.01)

(58) Field of Classification Search
CPC . G09G 2300/0804; H10K 59/35; H10K 59/31
See application file for complete search history.

(56) References Cited

U.S. PATENT DOCUMENTS

| | | |
|---|---|---|
| 2011/0212476 A1 | 9/2011 | Lowery et al. |
| 2012/0268476 A1 | 10/2012 | Park |
| 2017/0123249 A1 | 5/2017 | Yoshida et al. |
| 2017/0237009 A1 | 8/2017 | Kwak et al. |
| 2018/0130856 A1 | 5/2018 | Kim et al. |
| 2018/0212009 A1* | 7/2018 | Odaka .................... H10K 50/11 |
| 2019/0005889 A1* | 1/2019 | Kwon ...................... G09G 3/30 |
| 2019/0187850 A1* | 6/2019 | Kim ....................... G06F 1/1643 |
| 2019/0311683 A1* | 10/2019 | Park .................... G09G 3/3266 |

* cited by examiner

DISPLAY DEVICE

CROSS-REFERENCE TO RELATED APPLICATION(S)

This application is a continuation application of U.S. patent application Ser. No. 16/899,698 filed on Jun. 12, 2020, which is a continuation application of U.S. patent application Ser. No. 16/259,523 filed on Jan. 28, 2019 (now U.S. Pat. No. 10,686,017), which claims priority to and the benefit of Korean Patent Application No. 10-2018-0044651, filed on Apr. 17, 2018 in the Korean Intellectual Property Office (KIPO), the disclosures of which are incorporated herein in their entirety by reference.

BACKGROUND

1. Field

Embodiments relate to a display device. More particularly, embodiments relate to a display device including a chip-on-film package.

2. Description of the Related Art

A variety of displays have been developed. Examples include liquid crystal displays, plasma displays, field emission displays, light emitting diode displays, and organic light emitting diode displays.

These displays may include a display panel displaying an image and a driving IC for controlling the display of the image on the display panel. The driving IC may apply a control signal, an image signal, etc. to the display panel to drive the display panel. The driving IC may be in the form of a chip.

Many methods have been proposed for bonding the driving IC to the display panel. Examples include a tape automated bonding (TAB) method or a chip-on-glass (COG) method. In the TAB method, the driving IC is mounted on a tape carrier package (TCP). The TCP is then bonded to a pad of the display panel. In the COG method, the driving IC is directly bonded to the pad of the display panel. A chip-on-film (COF) method may be used to directly bond the driving IC to a flexible circuit board attached to the display panel.

SUMMARY

An object of the present inventive concept is to provide a display device for preventing electro-migration between wirings of a chip-on-film package.

In order to achieve the object of the present inventive concept described above, a display device may include a display panel including a substrate that includes a display area and a pad area adjacent to the display area, and a first pad and a second pad on the pad area of the substrate, and a chip-on-film package over the pad area of the substrate with the first pad and the second pad interposed between the substrate and the chip-on-film package, the chip-on-film package including an insulation layer, a first wiring on an upper surface of the insulation layer and electrically connected to the first pad, and a second wiring on a lower surface of the insulation layer and electrically connected to the second pad. A first signal having alternating voltage levels may be applied to the first wiring. A second signal having a constant voltage level may be applied to the second wiring.

In an embodiment, the first pad may be on a first pad portion of the pad area adjacent to the display area. The second pad may be on a second pad portion of the pad area spaced apart from the display area with the first pad portion disposed therebetween.

In an embodiment, the first pad and the second pad may be on the same level over the substrate.

In an embodiment, the display panel may further include a first pixel and a second pixel on the display area of the substrate, a first data line on the substrate and connecting the first pixel to the first pad, and a second data line on the substrate and connecting the second pixel to the second pad.

In an embodiment, the first pixel may be a red pixel or a blue pixel, and the second pixel may be a green pixel.

In an embodiment, the first signal may have a first voltage level and a second voltage level greater than the first voltage level.

In an embodiment, the display device may further include an anisotropic conductive film between the display panel and the chip-on-film package and electrically connecting the first pad and the second pad to the first wiring and the second wiring, respectively.

In an embodiment, the display panel may further include a protective film spaced apart from the first pad and the second pad with the substrate disposed therebetween, and a pressure sensitive adhesive layer between the substrate and the protective film.

In an embodiment, the chip-on-film package may further include a first solder resist layer on the upper surface of the insulation layer and covering the first wiring, and a second solder resist layer on the lower surface of the insulation layer and covering at least a portion of the second wiring.

In an embodiment, the first wiring may be electrically connected to the first pad through a via hole formed in the insulation layer.

In order to achieve the object of the present inventive concept described above, a display device may include a display panel including a display area, a pad area adjacent to the display area, a first pad portion at top left in the pad area in a plan view, a second pad portion at bottom left in the pad area in the plan view, a third pad portion at top right in the pad area in the plan view, and a fourth pad portion at bottom right in the pad area in the plan view, and a chip-on-film package overlapping the pad area, the chip-on-film package including an insulation layer, a plurality of first wirings on an upper surface of the insulation layer and electrically connected to the first pad portion and the third pad portion, and a plurality of second wirings on a lower surface of the insulation layer and electrically connected to the second pad portion and the fourth pad portion. A first signal having alternating voltage levels may be applied to the plurality of first wirings. A second signal having a constant voltage level may be applied to the plurality of second wirings.

In an embodiment, the display panel may further include a plurality of first pads in the first pad portion and the third pad portion and electrically connected to the plurality of first wirings, respectively, and a plurality of second pads in the second pad portion and the fourth pad portion and electrically connected to the plurality of second wirings, respectively.

In an embodiment, the display panel may further include a plurality of first pixels and a plurality of second pixels in the display area, a plurality of first data lines respectively connecting the plurality of first pixels to the plurality of first pads, and a plurality of second data lines respectively connecting the plurality of second pixels to the plurality of second pads.

In an embodiment, the plurality of first pixels and the plurality of second pixels may be alternately arranged with each other along a first direction. Two first pixels adjacent to each other in the first direction among the plurality of first pixels may emit different colors of light from each other. Two second pixels adjacent to each other in the first direction among the plurality of second pixels may emit the same color of light as each other.

In an embodiment, each of the plurality of first pixels may be a red pixel or a blue pixel, and each of the plurality of second pixels may be a green pixel.

In an embodiment, the plurality of first pads and the plurality of second pads may be alternately arranged along the first direction in the plan view.

In an embodiment, the display device may further include an anisotropic conductive film between the display panel and the chip-on-film package and electrically connecting the plurality of first pads and the plurality of second pads to the plurality of first wirings and the plurality of second wirings, respectively.

In an embodiment, the plurality of first wirings and the plurality of second wirings may be overlapped with each other in the plan view.

In an embodiment, the first signal may have a first voltage level and a second voltage level greater than the first voltage level.

In order to achieve the object of the present inventive concept described above, a display device may include a display panel comprising a substrate including a display area and a pad area adjacent to the display area, and a first pad and a second pad disposed on the pad area of the substrate, and a chip-on-film package overlapping the pad area in a plan view with the first pad and the second pad interposed between the substrate and the chip-on-film package. The chip-on-film package may include an insulation substrate, a first wiring disposed on an upper surface of the insulation substrate and electrically connected to the first pad, and a second wiring disposed on a lower surface of the insulation substrate which is close to the display panel than the upper surface and electrically connected to the second pad. Substantial portion of the first wiring and the second wiring may overlap each other in a plan view. The first wiring may supply a first signal which has alternating voltage levels to the first pad and the second wiring may supply a second signal which has a constant voltage level to the second pad.

In the display device according to the embodiments, the first signal having the alternating voltage levels may be applied to the first wiring of the chip-on-film package spaced apart from the display panel, and the second signal having the constant voltage level may be applied to the second wiring of the chip-on-film package adjacent to the display panel. Therefore, electro-migration between the wirings of the chip-on-film package may be prevented.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, display devices in accordance with embodiments of the present inventive concept will be explained in detail with reference to the accompanying drawings.

Hereinafter, elements of a display device according to an embodiment will be described with reference to FIGS. 1, 2, 3, 4, 5, and 6.

Figure 1:
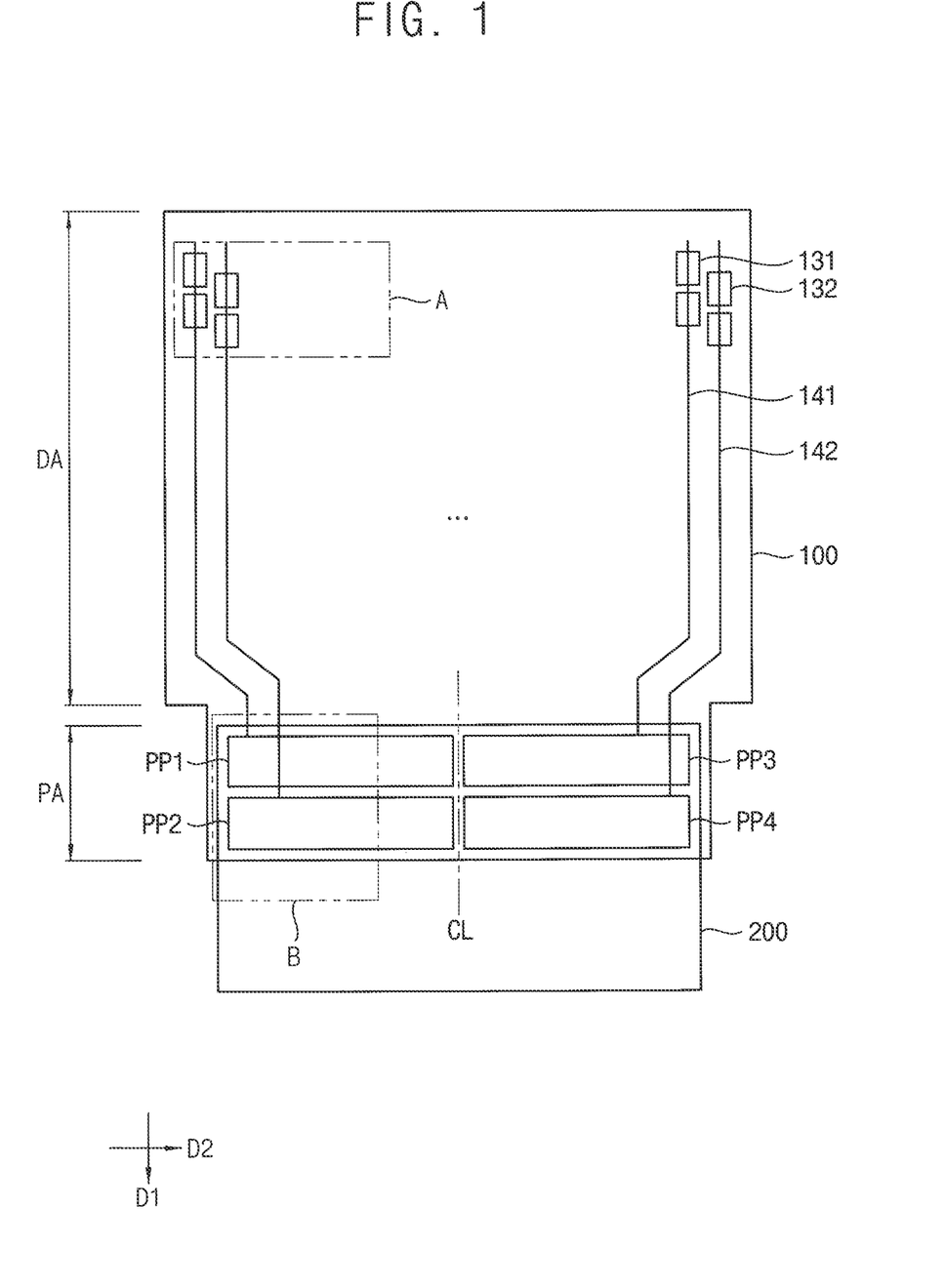
FIG. 1 is a plan view illustrating a display device according to an embodiment.

FIG. 1 is a plan view illustrating a display device according to an embodiment.

Referring to FIG. 1, a display device according to an embodiment may include a display panel 100 and a chip-on-film (COF) package 200. The chip-on-film package 200 may supply signals such as a control signal, an image signal, etc. to the display panel 100. The display panel 100 may display an image based on the signals.

The display panel 100 may include a display area DA and a pad area PA. The display area DA may display an image. The pad area PA may be disposed adjacent to the display area DA. For example, the pad area PA may be located in a first direction D1 from the display area DA. The display panel 100 may be electrically connected to external devices through the pad area PA.

The display panel 100 may include a plurality of gate lines (not shown). The gate lines may extend along a second direction D2 crossing the first direction D1, and may be arranged along the first direction D1.

The display panel 100 may include a plurality of data lines 141 and 142. The data lines 141 and 142 may extend along the first direction D1, and may be arranged along the second direction D2. The data lines 141 and 142 may cross and be insulated from the gate lines. The data lines 141 and 142 may extend from the display area DA to the pad area PA.

The display panel 100 may include a plurality of pixels 131 and 132. Each of the pixels 131 and 132 may be disposed in a space between adjacent gate lines and adjacent data lines 141 and 142. An image may be formed by a combination of light emitted from the pixels 131 and 132. For example, the pixels 131 and 132 may be arranged as a matrix form.

The pixels 131 and 132 may include a light emitting element including an organic light emitting layer. However, the present inventive concept is not limited thereto. The pixels 131 and 132 may include various elements for displaying an image such as a liquid crystal element, an electrophoretic element, an electrowetting element, etc.

Figure 2:
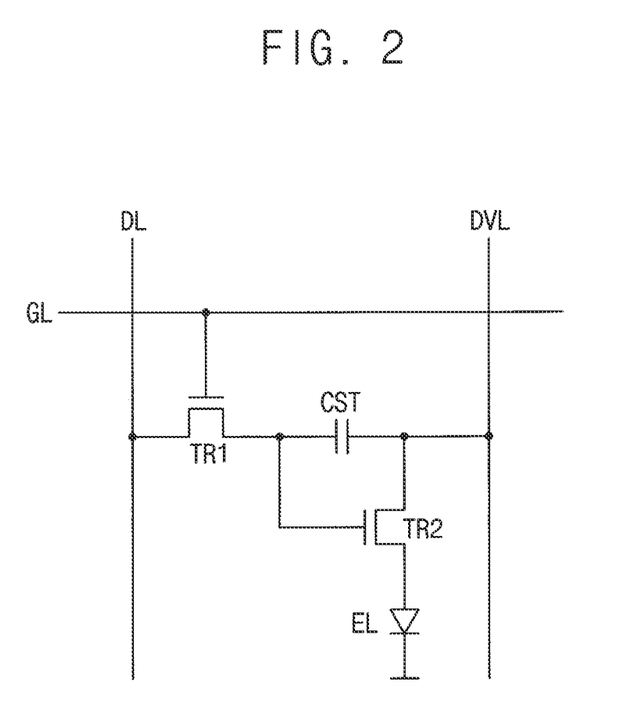
FIG. 2 is a circuit diagram illustrating a pixel of the display device in FIG. 1.

FIG. 2 is a circuit diagram illustrating the pixel 131 and 132 of the display device in FIG. 1.

Referring to FIG. 2, each of the pixels 131 and 132 may include thin film transistors TR1 and TR2, a light emitting element EL, and a capacitor CST which are connected to wirings such as a gate line GL, a data line DL, a driving voltage line DVL, etc. Here, the gate line GL and the data line DL illustrated in FIG. 2 may be the gate line and the data line 141 and 142 described with reference to FIG. 1, respectively.

The thin film transistors TR1 and TR2 may include a driving thin film transistor TR2 configured to control the light emitting element EL and a switching thin film transistor TR1 configured to control the driving thin film transistor TR2. In an embodiment, each pixel may include two thin film transistors TR1 and TR2 and one capacitor CST. However, the present inventive concept is not limited thereto. In another embodiment, each pixel may include one thin film transistor and one capacitor, or may include three or more thin film transistors and two or more capacitors. For example, each pixel may include seven thin film transistors, one light emitting element, and one capacitor.

The switching thin film transistor TR1 may include a gate electrode, a source electrode, and a drain electrode. In the switching thin film transistor TR1, the gate electrode may be connected to the gate line GL, and the source electrode may be connected to the data line DL. The drain electrode may be connected to a gate electrode of the driving thin film transistor TR2. The switching thin film transistor TR1 may transmit a data signal applied to the data line DL to the driving thin film transistor TR2 depending on a gate signal applied to the gate line GL.

The driving thin film transistor TR2 may include a gate electrode, a source electrode, and a drain electrode. In the driving thin film transistor TR2, the gate electrode may be connected to the drain of the switching thin film transistor TR1, and the source electrode may be connected to the driving voltage line DVL. The drain electrode may be connected to a anode of the light emitting element EL.

The light emitting element EL may include an emission layer, and a first electrode and a second electrode opposite to each other with the emission layer in between. The first electrode may be connected to the drain electrode of the driving thin film transistor TR2. The second electrode may be connected to a common voltage line (not shown), so that a common voltage may be applied to the second electrode. The emission layer may emit light depending on an output signal of the driving thin film transistor TR2 thereby displaying an image. Here, light emitted from the emission layer may vary depending on a material of the emission layer, and may be color light or white light.

The capacitor CST may be connected between the gate electrode and the source electrode of the driving thin film transistor TR2. The capacitor CST may charge and maintain the data signal inputted to the gate electrode of the driving thin film transistor TR2.

Figure 3:
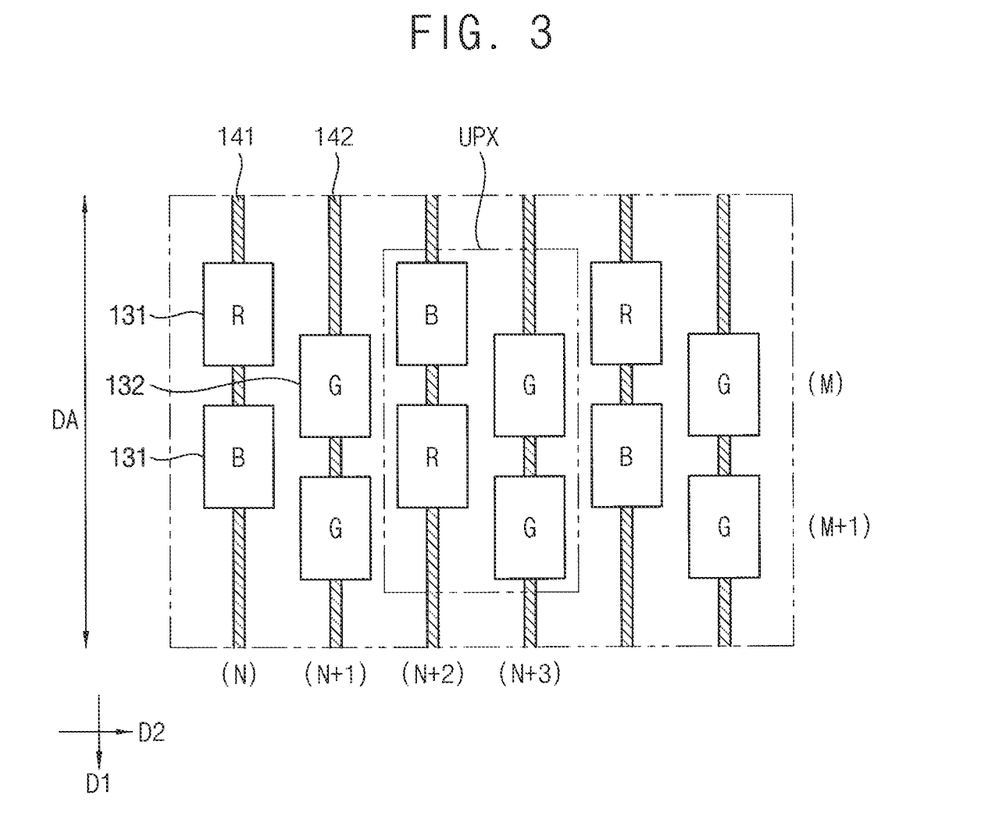
FIG. 3 is a plan view illustrating a display area of a display panel of the display device in FIG. 1.

FIG. 3 is a plan view illustrating the display area DA of the display panel 100 of the display device in FIG. 1. For example, FIG. 3 may be a plan view expanding an area A of the display device in FIG. 1.

Referring to FIG. 3, the data lines 141 and 142 may include a plurality of first data lines 141 and a plurality of second data lines 142. The first data lines 141 and the second data lines 142 may extend along the first direction D1. The first data lines 141 and the second data lines 142 may be alternately arranged along the second direction D2. In other words, one second data line 142 may be located between two first data lines 141 adjacent in the second direction D2, and one first data line 141 may be located between two second data lines 142 adjacent in the second direction D2.

The pixels 131 and 132 may include a plurality of first pixels 131 and a plurality of second pixels 132. The first pixels 131 may be connected to the first data lines 141. The second pixels 132 may be connected to the second data lines 142. The first pixels 131 may be arranged along the first direction D1 along which the first data line 141 extends. The second pixels 132 may be arranged along the first direction D1 along which the second data line 142 extends.

The first pixels 131 and the second pixels 132 may be alternately arranged along the second direction D2. In other words, one second pixel 132 may be located between two first pixels 131 adjacent in the second direction D2, and one first pixel 131 may be located between two second pixels 132 adjacent in the second direction D2. Further, two first pixels 131 adjacent to each other may emit different colors of light from each other, and two second pixels 132 adjacent to each other may emit the same color of light as each other. For example, one first pixel 131 may emit different color of light from two first pixels 131 adjacent in the first direction D1 and from two first pixels 131 adjacent in the second direction D2.

Each of the first pixels 131 may be a red pixel R or a blue pixel B. Each of the second pixels 132 may be a green pixel G. In this case, the first pixels 131 and the second pixels 132 may be disposed as a pentile matrix form. In an embodiment, one red pixel R, one blue pixel B, and two green pixel G may form an unit pixel UPX. However, the present inventive concept is not limited thereto. In another embodiment, one red pixel, one blue pixel, one green pixel, and one white pixel may form the unit pixel.

The red pixel R and the blue pixel B connected to the same first data line 141 may be alternately arranged along the first direction D1. Further, the red pixel R and the blue pixel B connected to different first data lines may be alternately arranged along the second direction. The green pixel G may be disposed between the red pixel R and the blue pixel B in the second direction D2. For example, the red pixel R may be disposed at a M-th row and a N-th column, the green pixel G may be disposed at the M-th row and a (N+1)-th column, the blue pixel B may be disposed at the M-th row and a (N+2)-th column, and the green pixel G may be disposed at the M-th row and a (N+3)-th column. Here, the M and the N are natural numbers. Accordingly, data signals applied to the first data lines 141 may drive the red pixel R and the blue pixel B, and data signals applied to the second data lines 142 may drive the green pixel G.

Referring to FIG. 1 again, the display panel 100 may include first to fourth pad portions PP1, PP2, PP3, and PP4. The first pad portion PP1 may be located at top left in the pad area PA. The second pad portion PP2 may be located at bottom left in the pad area PA. The third pad portion PP3 may be located at top right in the pad area PA. The fourth pad portion PP4 may be located at bottom right in the pad area PA. In other words, the first pad portion PP1 and the third pad portion PP3 may be located at a top row in the pad area PA, and the second pad portion PP2 and the fourth pad portion PP4 may be located at a bottom row in the pad area PA.

The first pad portion PP1 and the third pad portion PP3 may be symmetric with respect to a central line CL. The second pad portion PP2 and the fourth pad portion PP4 may be symmetric with respect to the central line CL. The central line CL may be an imaginary line that crosses a center of the pad area PA in the second direction D2, and extends along the first direction D1. The first pad portion PP1 and the second pad portion PP2 may be connected to the data lines 141 and 142 located at left side with respect to the central line CL. The third pad portion PP3 and the fourth pad portion PP4 may be connected to the data lines 141 and 142 located at right side with respect to the central line CL.

The first pad portion PP1 and the third pad portion PP3 located at the top row in the pad area PA may be connected to the first data lines 141. Accordingly, the first pad portion PP1 and the third pad portion PP3 may be electrically connected to the first pixels 131. The second pad portion PP2 and the fourth pad portion PP4 located at the bottom row in the pad area PA may be connected to the second data lines 142. Accordingly, the second pad portion PP2 and the fourth pad portion PP4 may be electrically connected to the second pixels 132.

Figure 4:
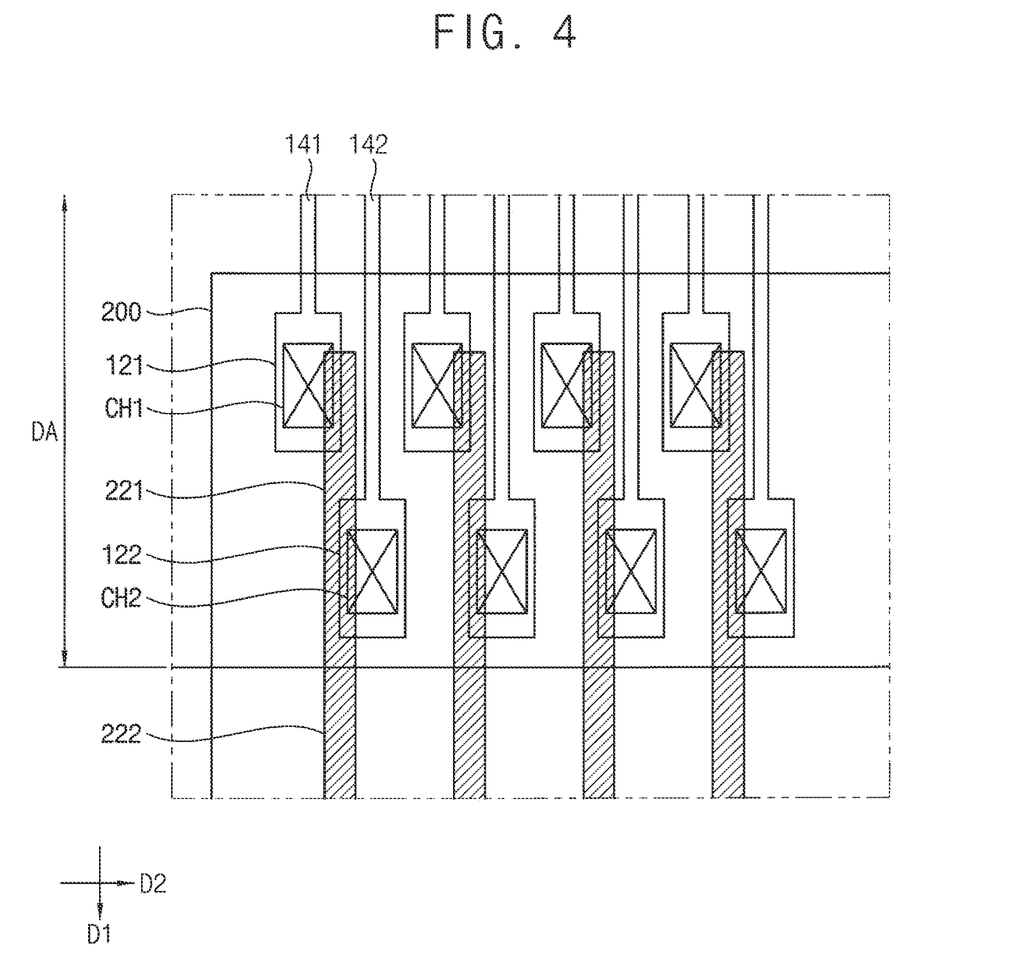
FIG. 4 is a plan view illustrating a pad area of the display panel of the display device in FIG. 1.

FIG. 4 is a plan view illustrating the pad area PA of the display panel 100 of the display device in FIG. 1. For example, FIG. 4 is a plan view expanding an area B of the display device in FIG. 1.

Referring to FIGS. 1 and 4, the display panel 100 may include a plurality of first pads 121 and a plurality of second pads 122 located in the pad area PA. The first pads 121 may be connected to the first data lines 141. The second pads 122 may be connected to the second data lines 142.

The first pads 121 may be located in the first pad portion PP1 and the third pad portion PP3. Specifically, the first pads 121 may be arranged along the second direction D2 at the top row in the pad area PA. The first pads 121 located in the first pad portion PP1 may be connected to the first data lines 141 located at left side with respect to the central line CL. The first pads 121 located in the third pad portion PP3 may be connected to the first data lines 141 located at right side with respect to the central line CL.

The second pads 122 may be located in the second pad portion PP2 and the fourth pad portion PP4. Specifically, the second pads 122 may be arranged along the second direction D2 at the bottom row in the pad area PA. The second pads 122 located in the second pad portion PP2 may be connected to the second data lines 142 located at left side with respect to the central line CL. The second pads 122 located in the fourth pad portion PP4 may be connected to the second data lines 142 located at right side with respect to the central line CL.

The first pads 121 and the second pads 122 may be alternately arranged to each other in the second direction D2 in a plan view. In other words, when watching the pad area PA from the display area PA in the first direction D1, the first pads 121 and the second pads 122 may not be overlapped with each other.

The chip-on-film package 200 may overlap the pad area PA of the display panel 100. The chip-on-film package 200 may include a plurality of first wirings 221 and a plurality of second wirings 222. The plurality of first wirings 221 and the plurality of second wirings 222 may overlap each other in a plan view. The plurality of first wirings 221 and the plurality of second wirings 222 may completely overlap each other in a plan view. The plurality of first wirings 221 and the plurality of second wirings 222 may completely overlap each other in a plan view except a pad portion formed at ends of the plurality of first wirings 221 and the plurality of second wirings 222.

The first wirings 221 may extend along the first direction D1, and may be arranged along the second direction D2. Ends of the first wirings 221 may be electrically connected to the first pads 121, respectively. Accordingly, data signals applied to the first wirings 221 may be transmitted to the first data lines 141 through the first pads 121.

The second wirings 222 may extend along the first direction D1, and may be arranged along the second direction D2. The second wirings 222 may be insulated from the first wirings 221. Ends of the second wirings 222 may be electrically connected to the second pads 122, respectively. Accordingly, data signals applied to the second wirings 222 may be transmitted to the second data lines 142 through the second pads 122.

An insulation layer (not shown) covering the first pads 121 and the second pads 122 may be formed on the display panel 100, and first contact holes CH1 exposing the first pads 121 and second contact holes CH2 exposing the second pads 122 may be formed in the insulation layer. The first wirings 221 may be electrically connected to the first pads 121 through the first contact holes CH1. The second wirings 222 may be electrically connected to the second pads 122 through the second contact holes CH2.

An anisotropic conductive film (300 in FIG. 5) may be interposed between the display panel 100 and the chip-on-film package 200, and the first wirings 221 and the second wirings 222 may be electrically connected to the first pads 121 and the second pads 122, respectively, through the anisotropic conductive film.

Figure 5:
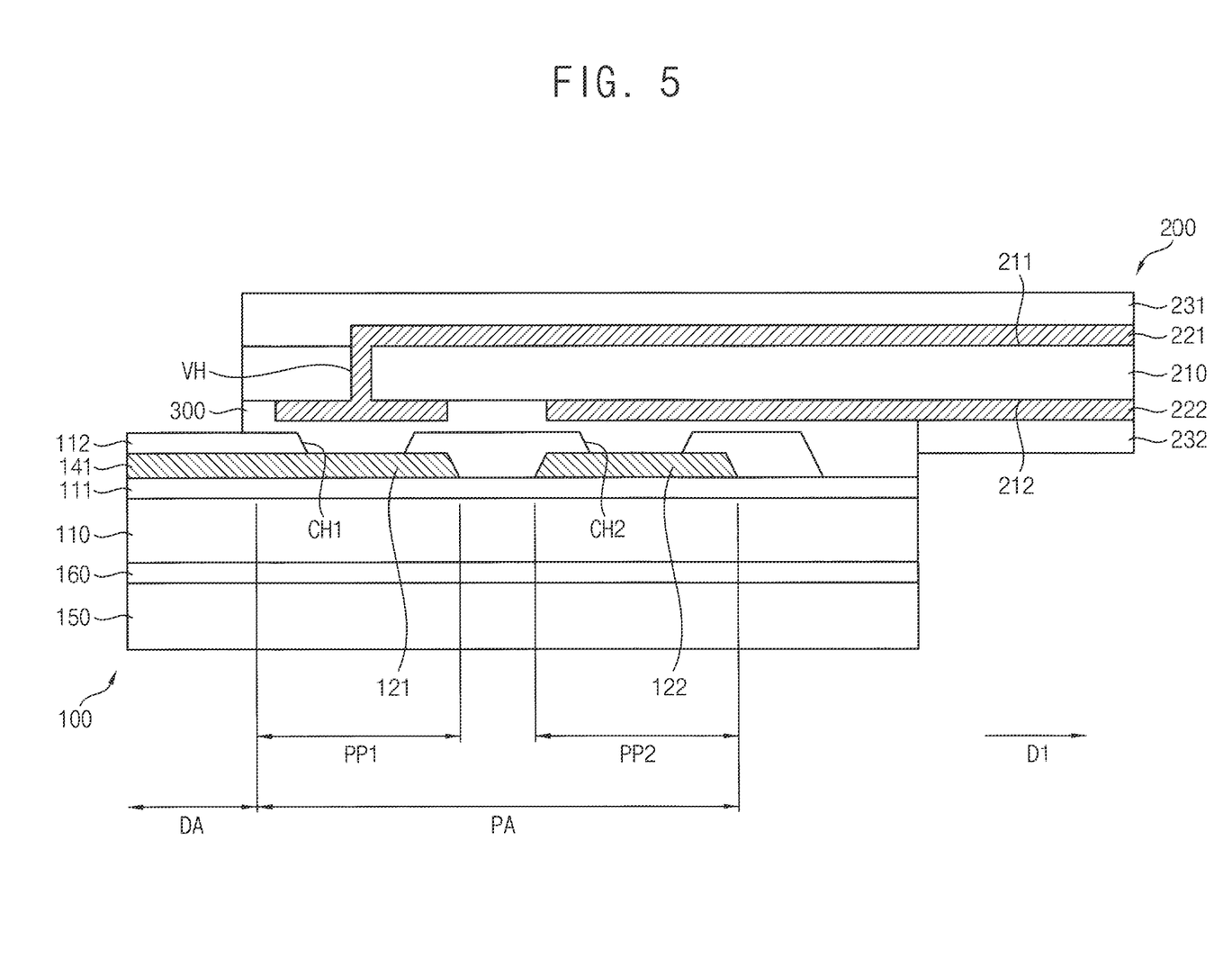
FIG. 5 is a cross-sectional view illustrating a display device according to an embodiment.

FIG. 5 is a cross-sectional view illustrating a display device according to an embodiment.

Referring to FIG. 5, the display panel 100 according to an embodiment may include a substrate 110, a first insulation layer 111, the first pad 121, the second pad 122, a second insulation layer 112, a protective film 150, and a pressure sensitive adhesive layer 160.

The substrate 110 may include the display area DA and the pad area PA. The first pad portion PP1 may be located in a portion of the pad area PA adjacent to the display area DA. The second pad portion PP2 may be located in a portion of the pad area PA spaced apart from the display area DA with the first pad portion PP1 disposed between the display area DA and the second pad portion PP2. The third pad portion PP3 in FIG. 1 and the fourth pad portion PP4 in FIG. 1 are not illustrated in FIG. 5. However, descriptions on the first pad portion PP1 and the second pad portion PP2 may be applied to the third pad portion PP3 and the fourth pad portion PP4, respectively.

The substrate 110 may be formed of insulation materials such as glass, resin, etc. Further, the substrate 110 may be formed of flexible materials such that the substrate 110 may be bent, rolled, or folded, and may have a single layer or a multi-layered structure. For example, the substrate 110 may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, or the like. The materials forming the substrate 110 may be variously changed, and the substrate 110 may be formed of fiber reinforced plastic (FRP), etc.

The first insulation layer 111 may be disposed on the substrate 110. The first insulation layer 111 may prevent impurities such as oxygen, moisture, etc. permeating through the substrate 110 from moving toward top of the substrate 110, and may provide a planarized surface to the top of the substrate 110.

The first insulation layer 111 may be formed of an inorganic insulation material such as silicon oxide, silicon nitride, silicon oxynitride, etc. or an organic insulation material, and may have a single layer or a multi-layered structure. Alternatively, the first insulation layer 111 may be omitted, and the first pad 121 and the second pad 122 may be directly disposed on an upper surface of the substrate 110.

The first pad 121 and the second pad 122 may be disposed on the first insulation layer 111. The first pad 121 may be located in the first pad portion PP1. The second pad 122 may be located in the second pad portion PP2. As described above, the first pad 121 may be connected to the first data line 141 extending from the display area DA to the pad area PA, and the second pad 122 may be connected to the second data line 142 in FIG. 1 extending from the display area DA to the pad area PA.

The first pad 121 and the second pad 122 may be formed of metal. For example, the first pad 121 and the second pad 122 may include at least one of metals such as gold (Au), silver (Ag), aluminum (Al), molybdenum (Mo), Chrome (Cr), titanium (Ti), nickel (Ni), neodymium (Nd), copper (Cu), etc., or alloys thereof. The first pad 121 and the second pad 122 may be formed as a single layer. However, the present embodiment is not limited thereto. The first pad 121 and the second pad 122 may be formed as a multi-layered structure in which two or more materials of the metals and the metal alloys are layered.

In an embodiment, the first pad 121 and the second pad 122 may be located on the same level over the substrate 110. As illustrated in FIG. 4, the first pad 121 and the second pad 122 may be alternately arranged along the second direction D2 in a plan view. Thus, the first pad 121 and the second pad 122 may not be electrically connected to each other although being located at the same level. For example, the first pad 121 and the second pad 122 may be disposed on an upper surface of the first insulation layer 111.

The second insulation layer 112 may be disposed on the first insulation layer 111 on the first pad 121 and the second pad 122. The second insulation layer 112 may partially cover the first pad 121 and the second pad 122. The second insulation layer 112 may be formed of an inorganic insulation material such as silicon oxide, silicon nitride, silicon oxynitride, etc. or an organic insulation material, and may have a single layer or a multi-layered structure.

The first contact hole CH1 and the second contact hole CH2 respectively exposing the first pad 121 and the second pad 122 may be formed in the second insulation layer 112. For example, the first contact hole CH1 may expose a central portion of an upper surface of the first pad 121, and the second contact hole CH2 may expose a central portion of an upper surface of the second pad 122.

The protective film 150 may be disposed to be spaced apart from the first pad 121 and the second pad 122 with the substrate 110 disposed therebetween. For example, the protective film 150 may be disposed on a lower surface of the substrate 110. The protective film 150 may absorb impact from outside to prevent the display device from being damaged. The protective film 150 may be formed of material including air such as cushion, sponge, etc. to absorb impact. For example, the protective film 150 may include polyethylene terephthalate (PET), etc.

The pressure sensitive adhesive layer 160 may be interposed between the substrate 110 and the protective film 150. The pressure sensitive adhesive layer 160 may attach the protective film 150 to the substrate 110. The pressure sensitive adhesive layer 160 may include polymer, cross-linking agent, or resin. The polymer may include at least one of acryl based polymer, silicon based polymer, and urethane based polymer. The pressure sensitive adhesive layer 160 may be conductive.

The chip-on-film package 200 may be disposed on the pad area PA of the substrate 110 with the first pad 121 and the second pad 122 disposed therebetween. The chip-on-film package 200 collectively refers to an insulation layer made of a thin film and wirings formed on the insulation layer. The chip-on-film package 200 may be referred to as a tape carrier package (TCP), a flexible printed circuit board (FPCB), or the like. The chip-on-film package 200 may include an insulation layer 210, the first wiring 221, the second wiring 222, a first solder resist layer 231, and a second solder resist layer 232. In an embodiment, a driving chip connected to the first wiring 221 and/or the second wiring 222 may be further formed on the insulation layer 210 of the chip-on-film package 200 together with the first wiring 221 and the second wiring 222.

The insulation layer 210 may have an upper surface 211 and a lower surface 212 opposite to each other. The lower surface 212 of the insulation layer 210 may face the display panel 100. The upper surface 211 of the insulation layer 210 may be opposite to the lower surface 212. The insulation layer 210 may be formed of an insulation material such as glass, resin, etc. Further, the insulation layer 210 may be formed of flexible materials such that the insulation layer 210 may be bent, rolled, or folded, and may have a single layer or a multi-layered structure. For example, the insulation layer 210 may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, or the like. The materials forming the insulation layer 210 may be variously changed, and the insulation layer 210 may be formed of fiber reinforced plastic (FRP), etc.

The first wiring 221 may be disposed on the upper surface 211 of the insulation layer 210. An end of the first wiring 221 may be located at the lower surface 212 of the insulation layer 210. A via hole VH passing through the insulation layer 210 may be formed in the insulation layer 210. The end of the first wiring 221 may be connected to a portion of the first wiring 221 located at the upper surface 211 of the insulation layer 210 through the via hole VH. Accordingly, the first wiring 221 may be electrically connected to the first pad 121 through the via hole VH.

The second wiring 222 may be disposed at the lower surface 212 of the insulation layer 210. An end of the second wiring 222 may be electrically connected to the second pad 122. When the first wiring 221 is disposed at the upper surface 211 of the insulation layer 210 and the second wiring 222 is disposed at the lower surface 212 of the insulation layer 210, a distance between the first wiring 221 and the display panel 100 may be greater than a distance between the second wiring 222 and the display panel 100.

The first wiring 221 and the second wiring 222 may be formed of metals. For example, the first wiring 221 and the second wiring 222 may include at least one of copper (Cu), silver (Ag), gold (Au), nickel (Ni), tin (Sb), plumbum (Pb), etc. The first wiring 221 and the second wiring 222 may be formed as a single layer. However, the present embodiment is not limited thereto. The first wiring 221 and the second wiring 222 may be formed as a multi-layered structure in which two or more materials of the metals are layered.

Figure 6:
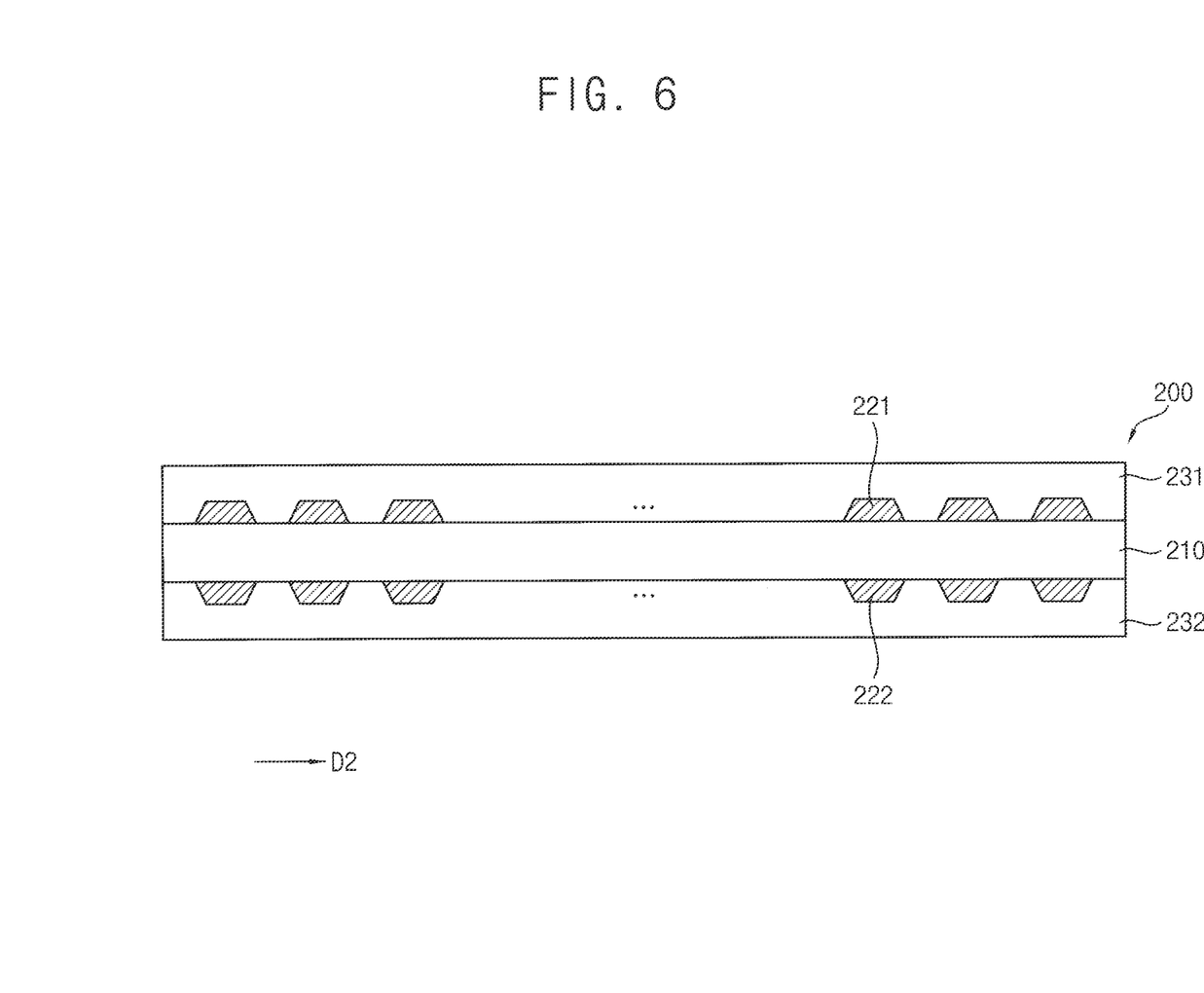
FIG. 6 is a cross-sectional view illustrating a chip-on-film package of the display device in FIG. 5.

FIG. 6 is a cross-sectional view illustrating the chip-on-film package 200 of the display device in FIG. 5.

Referring to FIG. 6, the first wirings 221 and the second wirings 222 may be overlapped with each other in a plan view. The first wirings 221 and the second wirings 222 may be disposed to be overlapped with each other, so that the first wirings 221 and the second wirings 222 may be relatively densely arranged on the insulation layer 210 in the second direction D2. Substantial portion of the first wiring 221 and the second wiring 222 may be overlap each other in a plan view. For example, more than half of the first wiring 221 and the second wiring 222 may be overlap each other in a plan view. Accordingly, the chip-on-film package 200 may include a relatively large number of the first wirings 221 and the second wirings 222.

Referring to FIG. 4, the first pad 121 and the second pad 122 may be alternately arranged along the second direction D2 in a plan view as mentioned above. The first wiring 221 and the second wiring 222 may be arranged along the second direction D2 to be overlapped to each other in a plan view. In this case, the first contact hole CH1 and the second contact hole CH2 in the second insulation layer 112 in FIG. 5 may be arranged in diagonal directions. Therefore, the first wiring 221 may be electrically connected to the first pad 121, and the second wiring 222 may be electrically connected to the second pad 122. For example, the first contact hole CH1 may be formed along a first row of pads thereby connecting the end of the first wiring 221 to the first pad 121, and the second contact hole CH2 may be formed along a second row of pads thereby connecting the end of the second wiring 222 to the second pad 122.

Referring to FIG. 5 again, the first solder resist layer 231 covering the first wiring 221 may be disposed on the upper surface 211 of the insulation layer 210, and the second solder resist layer 232 covering the second wiring 222 may be disposed on the lower surface 212 of the insulation layer 210. The second solder resist layer 232 may expose the end of the first wiring 221 and the end of the second wiring 222, so that the first wiring 221 and the second wiring 222 may be electrically connected to the first pad 121 and the second pad 122, respectively.

The first solder resist layer 231 and the second solder resist layer 232 may be made of a curable resin that is curable by heat or light. Examples of the curable resin that may be used herein include bisphenol A type epoxy resin, bisphenol F type resin, novolak type epoxy resin, phenol resin, urea resin, melamine resin, unsaturated polyester resin, resorcinol resin, or the like.

An anisotropic conductive film 300 may be interposed between the display panel 100 and the chip-on-film package 200. The anisotropic conductive film 300 may be provided between the first pad 121 and the end of the first wiring 221 and between the second pad 122 and the end of the second wiring 222, thereby electrically connecting the first pad 121 and the second pad 122 to the first wiring 221 and the second wiring 222, respectively.

The anisotropic conductive film 300 may include an organic polymer and a plurality of conductive balls included in the organic polymer. The organic polymer may be made of a curable resin that has adhesive property and is curable by heat or light. Examples of the curable resin that may be used herein include bisphenol A type epoxy resin, bisphenol F type resin, novolak type epoxy resin, phenol resin, urea resin, melamine resin, unsaturated polyester resin, resorcinol resin and the like.

The conductive balls may include metal such as gold (Au), silver (Ag), tin (Sn), nickel (Ni), chrome (Cr), iron (Fe), cobalt (Co), platinum (Pt), and copper (Cu) and an alloy thereof. Alternatively, the conductive balls may include a core that includes glass, ceramic or polymer resin, and the aforementioned metal or alloy thereof formed on a surface of the core.

The anisotropic conductive film 300 may be provided between the display panel 100 and the chip-on-film package 200. When the end of the first wiring 221 and the end of the second wiring 222 of the chip-on-film package 200 are compressed on the first pad 121 and the second pad 122 of the display panel 100, respectively, the first wiring 221 and the second wiring 222 may be electrically connected to the first pad 121 and the second pad 122, respectively, through the conductive balls.

Hereinafter, signals applied to the display device according to an embodiment will be described with reference to FIG. 7A and FIG. 7B.

Figure 7A:
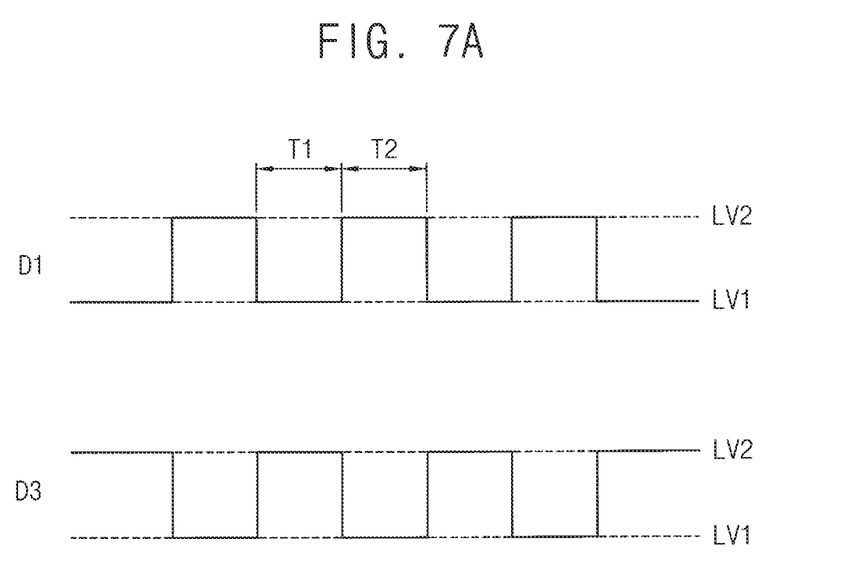
FIG. 7A is a timing diagram illustrating a first signal applied to the first wiring of the chip-on-film package and FIG. 7B is a timing diagram illustrating a second signal applied to the second wiring of the chip-on-film package.
Figure 7B:
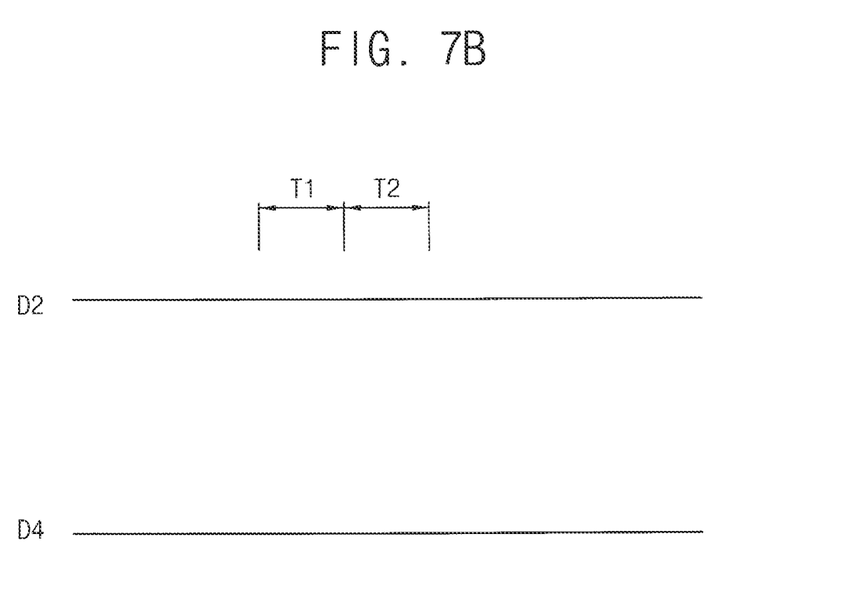

FIGS. 7A and 7B are timing diagrams illustrating signals according to an embodiment. For example, FIG. 7A may illustrate a first signal applied to the first wiring 221 of the chip-on-film package 200, and FIG. 7B may illustrate a second signal applied to the second wiring 222 of the chip-on-film package 200.

Referring to FIGS. 1, 3, 5, 7A and 7B, a first signal may be applied to the first wiring 221 of the chip-on-film package 200, and the first signal may be transmitted to the first pixel 131 through the first pad 121 and the first data line 141 of the display panel 100 which are electrically connected to the first wiring 221. A second signal may be applied to the second wiring 222 of the chip-on-film package 200, and the second signal may be transmitted to the second pixel 132 through the second pad 122 and the second data line 142 of the display panel 100 which are electrically connected to the second wiring 222.

The first signal may have alternating voltage levels, and the second signal may have a constant voltage level. In an embodiment, the first signal may have a first voltage level LV1 and a second voltage level LV2 greater than the first voltage level LV1. For example, the first voltage level LV1 may be a voltage level corresponding to a maximum grayscale of data, and the second voltage level LV2 may be a voltage level corresponding to a minimum grayscale of data. Hereinafter, it is exemplary described that the first signal and the second signal are transmitted to the first pixels 131 and the second pixels 132 illustrated in FIG. 3, respectively.

In an embodiment, when conducting a lighting test of the red pixels R, a first data signal D1 that is the first signal may be applied to the first data line 141 located at an N-th column, and a third data signal D3 that is the first signal may be applied to the first data line 141 located at an (N+2)-th column as disclosed in FIG. 7A. For example, the first voltage level LV1 of each of the first signals D1 and D2 may be about 1.5 V, and the second voltage level LV2 of each of the first signals D1 and D2 may be about 6 V. A signal may not be applied to the second data line 142.

During a first time period T1, a voltage of about 1.5 V may be applied to a red pixel R located at an M-th row and at the N-th column, and a voltage of about 6 V may be applied to a blue pixel B located at the M-th row and at the (N+2)-th column. In this case, the red pixels R at the M-th column may emit red light, and the blue pixels B at the M-th column may not emit light.

During a second time period T2, a voltage of about 6 V may be applied to a blue pixel B located at an (M+1)-th row and at the N-th column, and a voltage of about 1.5 V may be applied to the red pixel R located at the (M+1)-th row and at the (N+2)-th column. In this case, the blue pixels B at the (M+1)-th column may not emit light, and the red pixels R at the (M+1)-th column may emit red light. Accordingly, when conducting the lighting test of the red pixels R, the red pixels R may emit light, and the green pixels G and the blue pixels B may not emit light.

When the first signal having the alternating voltage levels is applied to the first wiring 221 of the chip-on-film package 200, a constant electric field may be formed between adjacent first wirings 221. For example, when the first data signal D1 and the third data signal D3 are applied to the adjacent first wirings 221, respectively, an electric field corresponding to a difference between the second voltage level LV2 and the first voltage level LV1 (e.g., about 4.5 V) may be formed between the adjacent first wirings 221.

In an embodiment, when conducting a lighting test of the green pixels G, a second data signal D2 that is the second signal may be applied to the second data line 142 located at the (N+1)-th column, and a fourth data signal D4 that is the second signal may be applied to the second data line 142 located at an (N+3)-th column as disclosed in FIG. 7B. For example, the voltage level of each of the second signals D3 and D4 may be about 2 V. A signal may not be applied to the first data line 141.

During the first time period T1, a voltage of about 2 V may be applied to a green pixel G located at the M-th row and at the (N+1)-th column, and a voltage of about 2 V may be applied to a green pixel G located at the M-th row and at the (N+3)-th column. In this case, the green pixels G at the M-th column may emit green light.

During the second time period T2, a voltage of about 2 V may be applied to a green pixel G located at the (M+1)-th row and at the (N+1)-th column, and a voltage of about 2 V may be applied to a green pixel G located at the (M+1)-th row and at the (N+3)-th column. In this case, the green pixels G at the (M+1)-th column may emit green light. Accordingly, when conducting the lighting test of the green pixels G, the green pixels G may emit light, and red pixels R and the blue pixels B may not emit light.

When the second signal having the constant voltage level is applied to the second wiring 222 of the chip-on-film package 200, an electric field may not be formed between adjacent second wirings 222. For example, when the second data signal D2 and the fourth data signal D4 are applied to the adjacent second wirings 222, respectively, an electric field may not be formed between the adjacent second wirings 222 because the voltage level of the second data signal D2 and the voltage level of the fourth data signal D4 are substantially the same.

Generally, when an electric field is formed between metal wirings and other related factors are combined, electro-migration, which is a transport of material caused by a gradual movement of ions in a conductor due to a momentum transfer between conducting electrons and diffusing metal atoms, may occur according to ionization of metal between the metal wirings. When the electro-migration occurs, insulation property of an insulation layer located between the metal wirings may be destructed, and the metal wirings may be short-circuited. For example, the other related factors may include moisture, temperature, other conductors, or the like.

In a display device according to a comparative example, wirings may be formed on a portion of a chip-on-film package adjacent to a display panel. Further, conductors may be formed on a portion of the display panel adjacent to the chip-on-film package. In this case, an electric field may be formed between the wirings, and the electro-migration may occur between the wirings of the chip-on-film package when moisture, etc. infiltrates into the display panel and/or the chip-on-film package.

However, in the chip-on-film package 200 of the display device according to the embodiments of the present inventive concept, the second signal having the constant voltage level may be applied to the second wirings 222 adjacent to the display panel 100, and the first signal having the alternating voltage levels may be applied to the first wirings 221 spaced apart from the display panel 100. In this case, an electric field may not be formed between the second wirings 222, so that the electro-migration may not occur. Further, an electric field may be formed between the first wirings 221, however, a distance between the first wiring 211 and the display panel 100 may be greater than a distance between the second wiring 222 and the display panel 100, and first wiring 221 may be insulated from the pressure sensitive adhesive layer 160, the anisotropic conductive film 300, etc. those are located under the chip-on-film package 200 by the insulation layer 210. Therefore, the electro-migration may not occur between the first wirings 221.

The display device according to the embodiments of the present inventive concept may be applied to a display device included in a computer, a notebook, a mobile phone, a smartphone, a smart pad, a PMP, a PDA, an MP3 player, or the like.

Although the display devices according to the embodiments of the present inventive concept have been described with reference to the drawings, the illustrated embodiments are examples, and may be modified and changed by a person having ordinary knowledge in the relevant technical field without departing from the technical spirit of the present inventive concept described in the following claims.

What is claimed is:

1. A display device comprising:
   a substrate comprising a display area and a pad area adjacent to the display area, the pad area comprising a first pad area and a second pad area;
   a first pixel, a second pixel, and a third pixel disposed in the display area on the substrate, and displaying a red color, a blue color, and a green color, respectively;
   a first pad in the first pad area on the substrate, the first pad being electrically connected to the first pixel and the second pixel; and
   a second pad in the second pad area on the substrate, the second pad being electrically connected to the third pixel;
   wherein the first pad area is between the display area and the second pad area, and
   wherein a signal having a constant voltage level is applied to the second pad.

2. The display device of claim 1, wherein the first pad is positioned at a same layer as the second pad over the substrate.

3. The display device of claim 1, wherein the first pad area is closer to the display area than the second pad area.

4. The display device of claim 1, wherein the first pixel and the second pixel are in a first column in the display area on the substrate, and
   wherein the third pixel is in a second column adjacent to the first column in the display area on the substrate.

5. The display device of claim 1, wherein a signal having alternating voltage levels is applied to the first pad.

6. A display device comprising:
   a substrate comprising a display area and a pad area adjacent to the display area, the pad area comprising a first pad area and a second pad area;
   a plurality of first pixels, a plurality of second pixels, and a plurality of third pixels disposed in the display area on the substrate, and displaying a red color, a blue color, and a green color, respectively;
   a plurality of first pads in the first pad area on the substrate, the plurality of first pads being electrically connected to the plurality of first pixels and the plurality of second pixels, respectively; and
   a plurality of second pads in the second pad area on the substrate, the plurality of second pads being electrically connected to the plurality of third pixels, respectively,
   wherein the first pad area is between the display area and the second pad area, and
   wherein a signal having a constant voltage level is applied to each of the plurality of second pads.

7. The display device of claim 6, wherein the plurality of first pads are positioned at a same layer as the plurality of second pads over the substrate.

8. The display device of claim 6, wherein the first pad area comprises a first pad portion in a left side of the first pad area in a plan view and a second pad portion in a right side of the first pad area in the plan view, and wherein the second pad area comprises a third pad portion in a left side of the second pad area in the plan view and a fourth pad portion in a right side of the second pad area in the plan view.

9. The display device of claim 6, wherein the plurality of first pixels and the plurality of second pixels are in odd columns in the display area on the substrate, and wherein the plurality of third pixels are in even columns in the display area on the substrate.

10. The display device of claim 6, wherein a signal having alternating voltage levels is applied to each of the plurality of first pads.

\* \* \* \* \*